United States Patent [19]
Goldstein

[11] Patent Number: 5,670,279
[45] Date of Patent: Sep. 23, 1997

[54] LITHOGRAPHY EXPOSURE MASK DERIVED FROM NANOCRYSTAL PRECURSORS AND A METHOD OF MANUFACTURING THE SAME

[75] Inventor: Avery N. Goldstein, Oak Park, Mich.

[73] Assignee: Starfire Electronic Development & Marketing, Ltd., Bloomfield Hills, Mich.

[21] Appl. No.: 512,167

[22] Filed: Aug. 7, 1995

Related U.S. Application Data

[63] Continuation-in-part of Ser. No. 217,160, Mar. 24, 1994, Pat. No. 5,576,248.
[51] Int. Cl.⁶ .................................................. G03F 9/00
[52] U.S. Cl. ............................ 430/5; 430/324; 430/330; 378/34; 378/35
[58] Field of Search ............................ 430/5, 311, 322, 430/324, 330; 378/34, 35

[56] References Cited

U.S. PATENT DOCUMENTS

| | | | |
|---|---|---|---|
| 4,515,876 | 5/1985 | Yoshihara et al. | 430/5 |
| 5,051,326 | 9/1991 | Celler et al. | 430/5 |
| 5,096,791 | 3/1992 | Yahalom | 430/5 |
| 5,318,687 | 6/1994 | Estes et al. | 205/80 |

*Primary Examiner*—S. Rosasco
*Attorney, Agent, or Firm*—Gifford, Krass, Groh, Sprinkle, Patmore, Anderson & Citkowski

[57] ABSTRACT

A high resolution exposure mask suitable for x-ray lithography is described in the present invention and a method of manufacturing the same. Nanocrystals of electron dense materials, preferably as a colloidal solution are applied to a surface of a low electron density substrate, so as to form features as fine as about 10 nanometers. The reduced melting and sintering temperatures associated with nanocrystals, compared with the bulk material allows for the use of more moderate processing conditions. Lessened interfacial stress between dissimilar layers results.

32 Claims, 5 Drawing Sheets

LITHOGRAPHY EXPOSURE MASK DERIVED FROM NANOCRYSTAL PRECURSORS AND A METHOD OF MANUFACTURING THE SAME

REFERENCE TO RELATED APPLICATIONS

This application is a continuation-in-part of application Ser. No. 08/217,160, filed Mar. 24, 1994, now U.S. Pat. No. 5,576,248.

FIELD OF THE INVENTION

The present invention relates to an exposure mask used in the formation of fine patterns of submicron dimensions through the technique of lithography, a method of manufacturing same, and an exposure method using the same.

BACKGROUND OF THE INVENTION

There is currently a demand for semiconductor integrated circuits (ICs) with increased packing density and reduced pattern dimensions. The formation of fine patterns by photolithographic techniques requires that a pattern be defined on a target photoresist. Typically, a mask is interceded between the light source and the target photoresist, in order to form a pattern on the target photoresist. The feature linewidth resolution is degraded by diffraction, interference, and incident photon beam divergence effects. An approximate expression which relates to feature linewidth resolution is the Fresnel number, f; given by $f = W^2/G\lambda$, where W is the feature dimension, G is the spacing between the mask and the target photoresist and $\lambda$ is the wavelength of the incident light beam. F values of about greater than 0.5 are deemed the acceptable resolution limit.

The Fresnel number makes it apparent that reducing the incident wavelength allows for finer feature resolution. X-ray lithography, which uses wavelengths ranging from about 0.1 to 2.0 nm offers the possibility of patterning features that are finer than those attainable with conventional visible and ultraviolet light sources. The supposition of X-rays as the incident light beam impinging on the lithography mask results in the feature resolution being limited to: (1) the proximity between the mask and the target photoresist, G and (2) the mask feature dimension, W. In practice, the proximity between the mask and target photoresist cannot be controlled to better than about 10 µm in a production environment, therefore the parameter most amenable to improvement is mask feature resolution.

A useful X-ray lithography mask must be stable over time towards radiation exposure and have well defined regions of widely varying electron density. The prior art discloses a variety of materials for use as thin, low electron density layers onto which high electron density features are patterned, these thin, low electron density layers cited as being typically less than 10 µm thick include: Si, SiC, BN, $S_1n$, $Si_3N_4$, $B_4C$, AlN, $SiO_2$, $B_2O_3$ and $Al_2O_3$.

Onto a thin, low electron density substrate, a high electron density material is deposited to a thickness sufficient to provide appreciable contrast between the regions of the target photoresist exposed to the incident photons through only the substrate, and the overlayed substrate. High electron density materials used previously include: Au, W, Pt, Ta, Re and compounds thereof. Gold is the only metal commonly used as a high electron density material because of the high melting temperatures of the other materials produces high stresses when the metals are deposited as thin films. The high melting temperatures associated with high electron density materials results in deformation of the low electron density substrate and interfacial stresses (S. A. Estes, T. R. Faure and S. C. Nash, U.S. Pat. No. 5,318,687).

Techniques for applying features of low X-ray transmittance material onto a substrate include: chemical vapor deposition (CVD), electrodeposition, ion etching, chemical etching and the like. Techniques involving deposition yield a distribution in the quantity of material laid down, as a function of distance from the deposition source varies. Thereby, limiting the minimal feature dimensions attainable. Etching processes exhibit undercutting, by which features designed to be steep walls actually have sloping edge profiles. The dimension at which a feature no longer has a steep profile defines the feature resolution.

SUMMARY OF THE INVENTION

It is an object of the present invention to provide an exposure mask and a method for producing the same. The exposure mask is characterized in having feature dimensions as fine as 10 nanometers or less, and moderate deposition conditions so as to lessen interfacial stress between dissimilar materials.

A method for manufacturing an exposure mask with fine feature thin film regions composed of a high electron density material on a low electron density substrate in accordance with the present invention comprises the steps of (i) providing a supporting substrate; (ii) depositing a layer of a radiation sensitive resist material on the substrate; (iii) patterning the resist by exposure using an appropriate form of radiation; (iv) exposure to an appropriate form of radiation; (v) exposure to a gas phase or colloidal solution of nanocrystals, so as to form a contiguous three-dimensional network corresponding to the pattern in said resist; (vi) sintering the nanocrystals at a reduced temperature compared to that required for bulk sintering; and (vii) removing the remaining radiation sensitive resist material.

DETAILED DESCRIPTION OF THE INVENTION

The background art highlights the following difficulties in producing lithography exposure masks: (1) the deposition of refractory metals as thin films, on a substrate leads to high interfacial stresses which distort and or damage the mask; and (2) producing fine exposure mask features, of a variety of shapes and sizes characterized by high height-to-width aspect ratios and steep vertical walls.

A refractory metal is defined as a metal or alloy having a high mean atomic number, Z and is characterized by a high melting temperature. For the purposes of this invention, refractory metals include Au, W, Ta, Re, Pd, Pt and the like. The high mean Z value makes refractory metals a class of high electron density materials. Since incident high energy radiation is scattered by interaction with electrons, these materials are efficient scatterers. The present invention largely overcomes the aforementioned difficulties by forming fine features of the electron dense material from nanometer sized particles. Crystalline particles having dimensions on the scale of nanometers from 1 to about 30 nm are termed nanocrystals. High surface-to-volume ratios, reduced coordination number of surface atoms and a high ratios of curvature in this size regime all contribute to raise the chemical potential of a solid nanocrystal relative to that of the bulk solid. The decreased stability of the solid nanocrystal, relative to the bulk is manifest as a decreased melting temperature.

Figure 1:
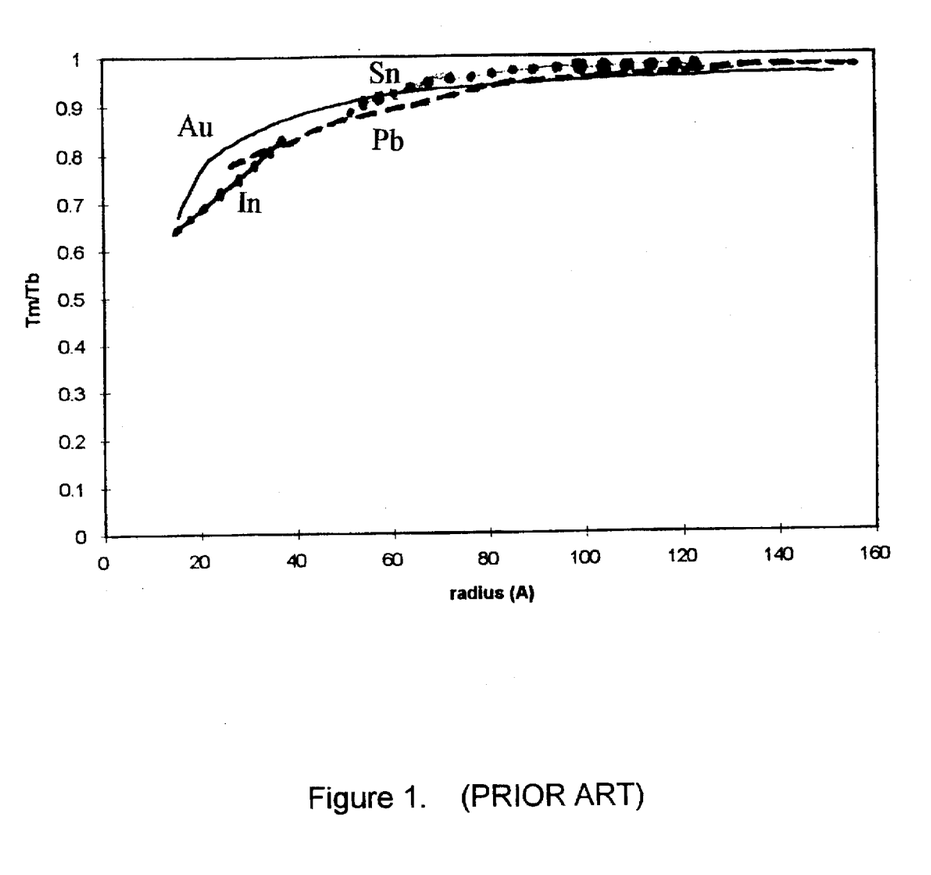
FIG. 1 is a graph of the reduced melting temperature for a variety of metals.

Metallic nanocrystals have been shown to have reduced melting temperatures compared with the bulk. The depression in melting and annealing temperature is evident throughout the nanocrystal size regime, but in the preferred embodiment these materials range in size from 1 to 6 nm. Melting studies on a range of metallic nanocrystals have established that the melting temperature is size dependent in the nanometer size regime and is approximately proportional to the inverse particle radius. The size dependent melting temperature of metallic nanocrystals has included studies of Au (Ph. Buffat and J-P. Borel, Phys. Rev. A, 13, 2287 (1976)), Pb and In (C. J. Coombes, J. Phys., 2, 441 (1972)), Al (J. Eckert, J. C. Holzer, C. C. Ahn, Z. Fu and W. L. Johnson, Nanostruct. Matls, 2, 407 (1993)) and Sn (C. R. M. Wronski, Brit. J. Appl. Phys., 18, 1731 (1967)). The reduction in melting temperature as a function of nanocrystal size can be enormous. For example, 2 nm Au nanocrystals melt at about 400° C., as compared to 1065° C. for bulk gold. FIG. 1 shows the generality of the reduction of melting temperature as a function of size. The ratio of size dependent melting temperature, Tm to the bulk melting temperature, Tb versus particle size follows approximately an inverse radius dependence, based on the references cited above.

It is a commonly held rule in material processing that sintering begins to occur at approximately two-thirds of the melting temperature (in degrees Kelvin), as such nanocrystals possess a reduced sintering temperature, as compared to the bulk. The reduction in melting and sintering temperature exhibited by nanocrystals is exploited in the present invention.

Metallic nanocrystals are also characterized by higher surface energies than the corresponding bulk crystal faces. Au, Pt (C. Solliard and M. Flueli, Sur. Sci, 156,487 (1985)) and Al (J. Wolterdorf, A. S. Nepijko and E. Pippel, Sur. Sci. 106, 64 (1981)) have shown surface energies that are 10 to 400% greater for nanocrystals than for the bulk material. The increased surface energies and areas associated with nanocrystals results in a lower activation energy for densification. The low thermal input and ease of densification couple to yield thin films with reduced stresses. An improvement of the invention over the prior art is the formation of thin film features of high electron density material under mild conditions, resulting in low internal and interfacial stresses in the exposure mask.

Figure 2:
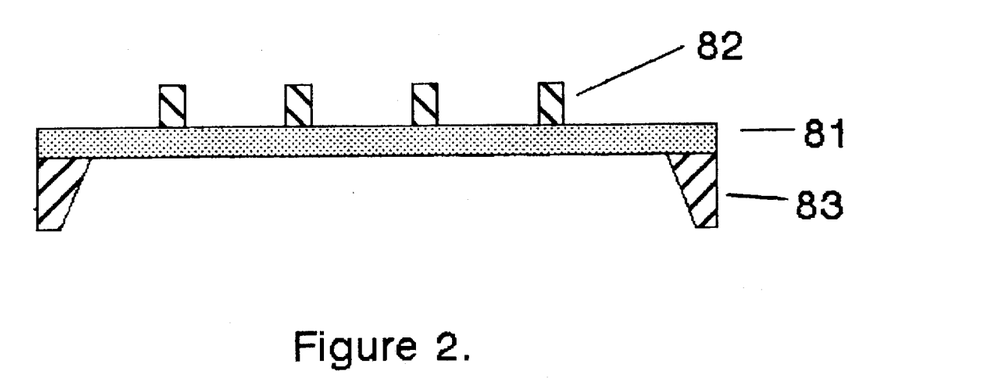
FIGS. 2 and 3 are a cross-sectional schematics illustrating embodiments of the present invention, the relative scale being modified for visual clarity.
Figure 3:
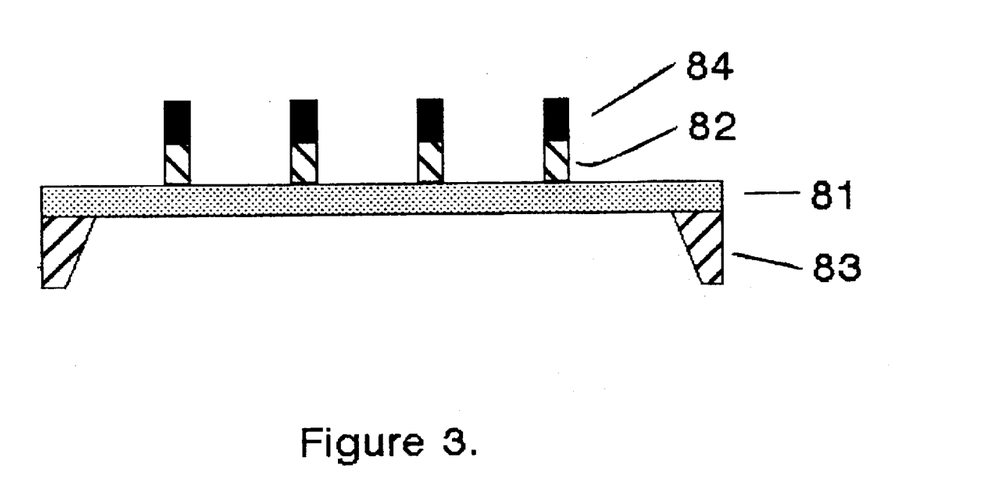

FIGS. 2 and 3 show in cross section, two embodiments of an exposure mask according to the present invention. In FIG. 2, 81 represents a thin, low electron density layer. The thickness of this layer is dictated by rigidity, processing and contrast constraints. Thicknesses of about 2 microns are typical. Materials operative as 81 include, but are not limited to low electron density ceramics (i.e., SiC, SiN, $Si_3N_4$, AlN, $Al_2O_3$, $B_4C$, $AlB_4C$, BN, Be & BeO) and thermally stable polymeric materials (i.e. polyimides, polyamides, polycarbonates, MYLAR & polyester). It is inherent in the design that 81 may represent a multiplicity of layers, of at least two of the aforementioned materials. A multilayer is useful in instances wherein the mechanical properties of one low electron density material are attractive, but better adhesion and or thermal expansion matching is obtained with a second material.

A supporting ring, 83 facilitates handling and is attached to bonded to one surface of 81. Silicon and a variety of glasses, including borosilicate and PYREX® are functional examples of support ring materials. Onto the distal surface of 81, relative to 83, a fine feature pattern of a high electron density material, 82 is deposited as nanocrystal precursors, according to the deposition process of the invention. The high electron density material may be Au, W, Ta, Re, Pd and Pt, or any combination thereof.

FIG. 3 represents substantially the same invention as that shown in FIG. 2, except that the initial high electron density layer, 82 is further overlayered by a secondary layer of a high electron density material, 84. The secondary layer, 84 is selected from the same group as the initial and may be the same, or different than the material comprising said initial layer. Sequential transmission of X-rays, for instance through similar, but not identical materials is often useful in reducing parasitic scattering and polychromaticity of the transmitted beam.

Figure 4A:
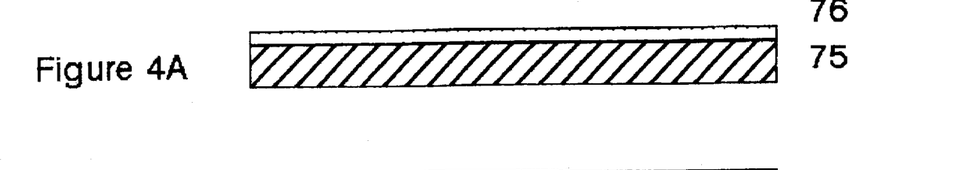
FIGS. 4A–G are schematic, modified-scale cross-sectional views illustrating the sequential steps in one embodiment of a method for fabricating an exposure mask according to the present invention.

A process by which the present invention is practiced is shown in FIGS. 4A–G. In FIG. 4A, a thin film of a low electron density material is deposited on one side of a base layer, 75; preferably a silicon wafer. The method of deposition is dependent on the nature of the low electron density layer and is established in the art: usually, polymeric materials are best applied by spin casting; metals by vapor deposition; ceramics by various techniques of RF sputtering, chemical vapor deposition and in selected cases by surface oxidation or nitridation of the base layer.

Figure 4B:
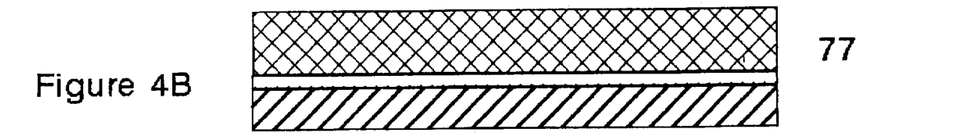

In FIG. 4B, an irradiation sensitive resist, 77 is spun onto the low electron density layer, 76. In the preferred embodiment, the resist is X-ray sensitive, and positive or negative patterning is accomplished using an electron beam tool. Practical electron beam photoresists include chloromethylated polystyrene; polymethylmethacrylate, polydiarylorthophthalate and paraffin. While visible or ultraviolet photoresists are functional within the instant invention, it is recognized that these longer wavelengths are not capable of defining ultrafine features as small as 10 nm or less, which are otherwise attainable herein.

Figure 4C:
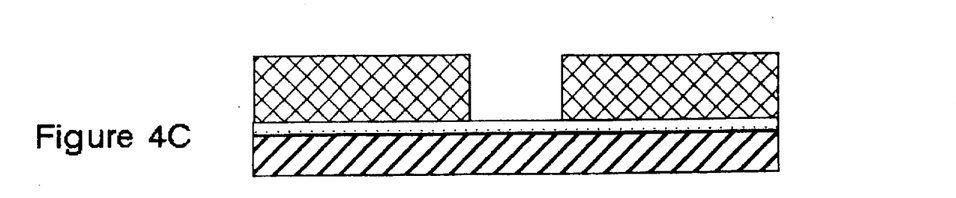

In FIG. 4C, the desired fine feature pattern is written in the resist. The resist is developed in the commonly practiced fashion, resulting in a groove pattern of features defined on the basal surface by 76 and on the sides by resist, 77.

Figure 4D:
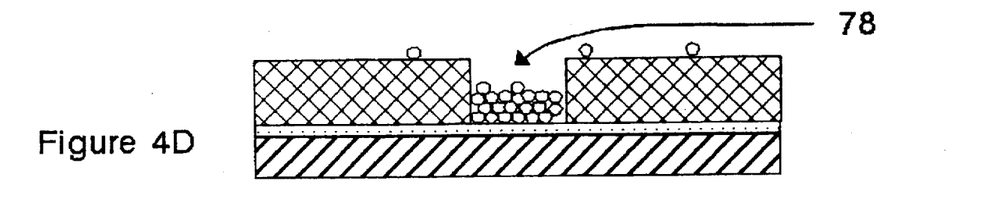

In FIG. 4D, the patterned, resist coated surface of the low electron density layer, 76 is exposed to a source of gas phase or colloidal nanocrystals. The nanocrystal number density being such that a contiguous, three-dimensional network results within the resist grooves. In the case of colloidal nanocrystals, the solvent is then allowed to evaporate; it is recognized that repeated applications of colloidal nanocrystals may be necessary to build a sufficient depth of nanocrystal agglomerates. The mean size of the nanocrystals, 78 being such that the reduced temperature sintering or fusion process does not introduce strain or distortion into the high electron density material, 76. The high electron density material may be for purposes of this invention Au, W, Ta, Re, Pd, Pt, depleted U, and those lathanide series elements that form water-stable chlorides. A homogenous nanocrystal source, a single type of material is operative in the present invention; as is a hetergenous mixture of different types of nanocrystals. Different composites of nanocrystals serve to form alloys or intermetallic compounds with improved properties relative to the pure materials.

The use of colloidal nanocrystals represents a preferred embodiment. Colloidal syntheses of a variety of metal nanocrystals operates under thermodynamic control, resulting in monodisperse particles (M. N. Vargaftik et al, J. Chem. Soc., Faraday Dis, 92, 13 (1992); H. Hirai, J. Makromol. Sci.- Chem. series A 13, 633 (1979); D. Richard et al, Faraday Discuss. 92, 109 (1991)). The uniform size distribution of nanocrystals obtained therethrough provides adjustable and narrow ranges of melting, sintering and fusion temperatures. The ability to control interactions between colloidal nanocrystals and the resist, 77 and the low electron density layer, 76 through the use of surfactants is of further advantage. Addition of surfactants to modify the wettability of surfaces exposed to the colloidal nanocrystal solution, or alternatively, by modifying the moieties protruding from the nanocrystal, thus control over nanocrystal-mask surface interactions can be exercised. Furthermore, the literature is replete with instances wherein dopants are required to lessen thermal expansion mismatch or otherwise enhance the structure or processing between the high and low electron density material layers. For instance, a small amount of arsenite demonstrably improves the performance of Au containing X-ray lithography masks (U.S. Pat. No. 5,318,687). The dissolution of an appropriate dopant as a salt in the colloidal solution is an elegant means for obtaining features with uniform dopant distributions.

Colloidal nanocrystals of the lathanide series metals and depleted uranium are also operative in the present invention, in addition to the refractory transition metals previously known to the art. Reduction of the water stable metal chlorides with strong organic reducing agents in a manner analogous to the preparation of Ru particles is employed (D. Richard et al, Faraday Discuss., 92, 109 (1991)). Dialysis of the nanocrystal solution to remove excess reagents prior to application to the substrate yields a useable reagent. The unique electronic properties of the lathanide series and depleted uranium make these metals attractive candidates for attenuation of certain light wavelengths.

Colloidal nanocrystals as precursors for the formation of fine pattern features offers a unique attribute which differentiates the exposure mask produced therethrough from the prior art: a liquid phase nanocrystal is capable of filling any indentation accessible to the liquid. Whereas, in deposition techniques, atoms adhere at the site of initial contact with the substrate, colloidal nanocrystals are free to sample multiple binding sites. The evaporation of the solvent tends to pool and thereby concentrate the nanocrystals in recesses. This serves to direct the nanocrystals into the desired patterning regions, in so doing making efficient use of materials.

Figure 4E:
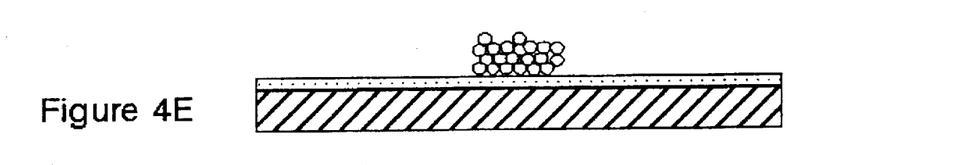

In FIG. 4E, the remaining resist, 77 is removed by conventional means. The remaining three-dimensional network of nanocrystals is present in the pattern originally scribed in the resist.

Figure 4F:
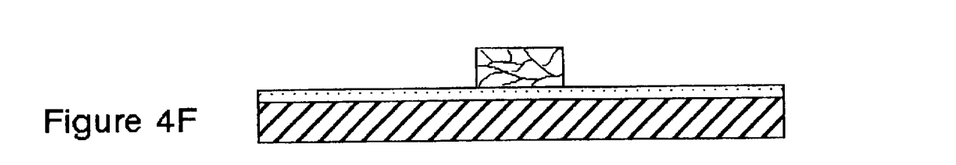

In FIG. 4F, the nanocrystals are sintered or otherwise fused to form a polycrystalline; monolithic feature. The characteristic that differentiates this step from the prior art is the reduced melting temperature necessary to sinter or otherwise fuse the nanocrystals, relative to the bulk. The ability to control the sintering temperature of a material through the choice of nanocrystal size makes the present invention operative with several polymeric substrates, 86 which can tolerate the reduced thermal processing associated with nanocrystals; these include, but are not limited to polyamides, polyimides, MYLAR, polyester and polycarbonates. The modest heating required to form bonding between contiguous nanocrystals and the high grain boundary density alleviate much of the stress that is incorporated by processes involving sputtering or evaporation of the bulk material onto the low electron density substrate. The heating of said nanocrystal network is carried out by standard means including resistive heating, transient laser irradiation, connective heating and the like. The heating of the nanocrystal network to the size dependent melting temperature for anything other than transient periods results in distortion of the pattern features and at least nominal volatilization of material. Rounding of distinct edges and reduced aspect ratios characterize samples that have been excessively heated.

Figure 4G:
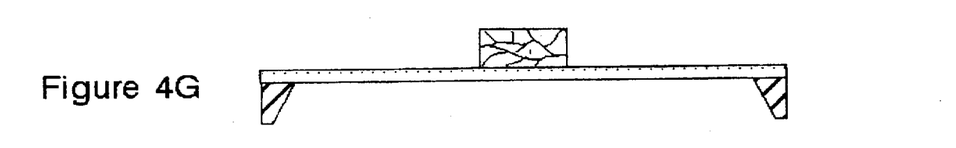
Figure 5A:
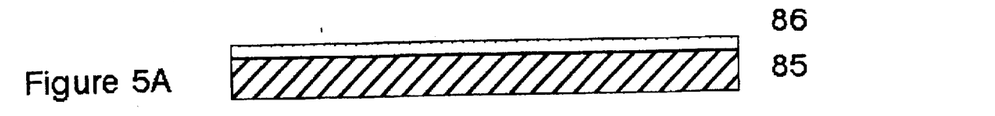
FIGS. 5A–H are schematic, modified-scale cross-sectional views illustrating the sequential steps in producing an exposure mask comprised of a multiplicity of types of nanocrystals.
Figure 5B:
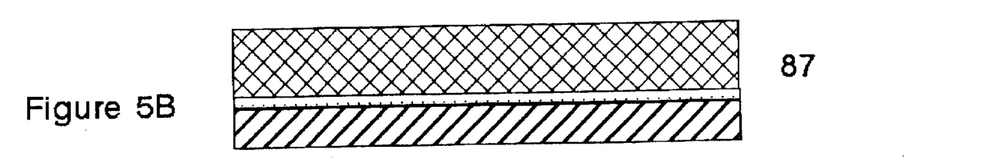
Figure 5C:
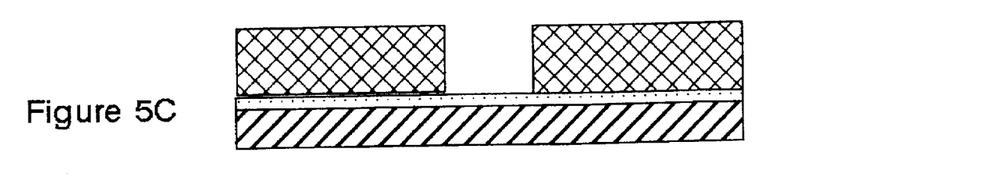
Figure 5D:
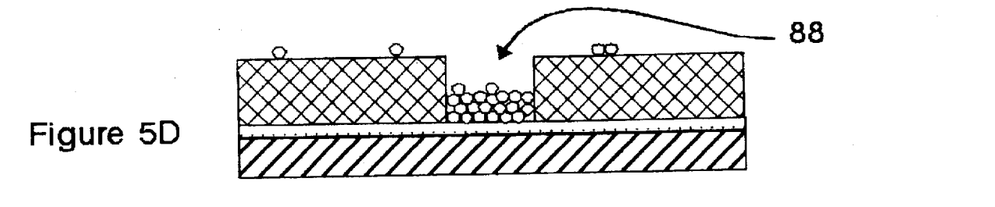
Figure 5E:
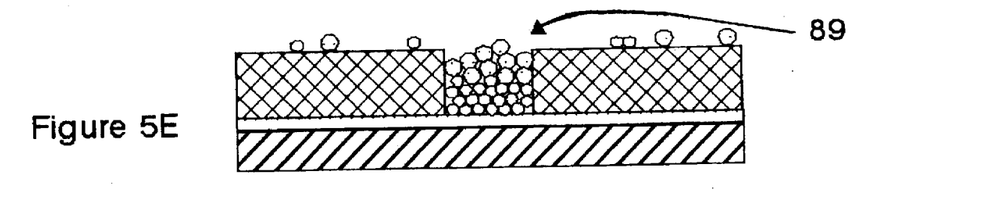
Figure 5F:
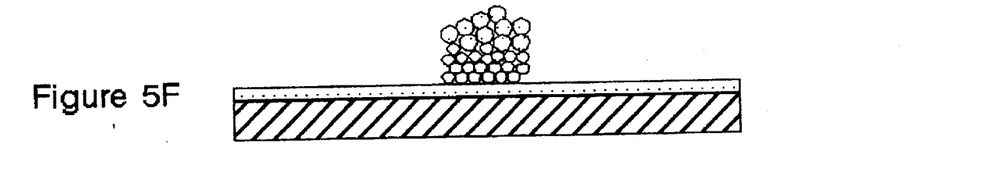
Figure 5G:
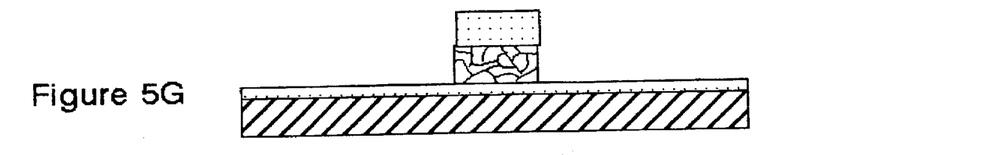
Figure 5H:
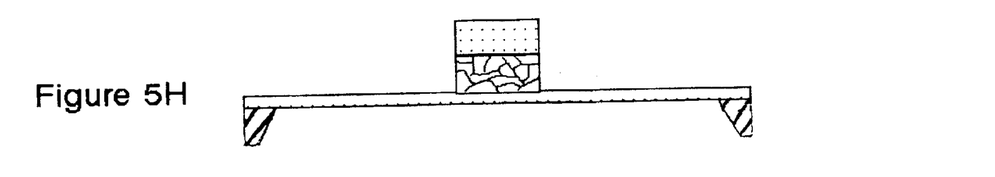

In FIG. 4G, the base layer, 75 is subjected to an etching process so as to form a supporting frame. Mineral acid etching is a commonly practiced art, especially in application to silicon and SiO2 base materials.

An exposure mask as depicted in the embodiment of FIG. 3, is produced by the process of steps illustrated schematically in FIGS. 5A–H. The base layer, 85 is covered with a low electron density substrate, 86; which in turn is overlayered with a irradiation sensitive resin, 87. The sequence of steps illustrated in FIGS. 5A–H largely mirror those recited in FIG. 4, with one exception. In the instant embodiment, the exposure of the patterned, resist coated surface of the low electron density layer, 86 is repeated, FIGS. 5D and 5E. While the embodiment associated with FIG. 4 teaches that repeated exposure of the nanocrystal source is often required to build the desired thickness, the embodiment depicted in FIG. 5 utilizes a compositionally different homogenous or hererogenous nanocrystal solution in the secondary sequence of exposure, FIG. 5E. The second nanocrystal solution, 89 illustrated in FIG. 5E results in an exposure mask possessing an interface between the disparate high electron density layers when 88 and 89 are different materials or a gradient interface when 88 and 89 are compositionally different mixtures of a common material.

The mixture of materials different nanocrystals that upon sintering form alloys or alternatively, nanocrystals composed of a core of one material surrounded by a shell of a second material offer several benefits (G. Schmid, Chem. Rev., 92, 1709 (1992)). The formation of alloys in the case of an exposure mask allows one to exact control over the electron density of the alloy, the melting temperature and the interfacial adhesion to the underlying low electron density support film.

Since the X-ray absorption efficiency depends on the electronic structure of the high electron density material, the overall incident radiation attenuation can be increased by forming alloys or intermetallic compounds. In instances wherein a highly effective metal is impractical due to excessive processing requirements or interfacial stress, an alloy often represents a workable compromise. For example, a 10 dB attenuation of Al-K radiation is obtained with about 720 nm Ta, as compared to 880 nm Pt, however; the bulk melting temperatures for Ta and Pt are 3020° C. and 1769° C., respectively. The deposition of Ta onto a substrate that is thousands of degrees Celsius below that of the metal source leads to considerable stress in the films thereby produced. An alloy composed of 53 atomic % Ta with Pt has a bulk melting temperature of 1760° C., which provides one with an exposure mask with the processing requirements of Pt, yet is superior to Pt as an attenuator of Al-K radiation.

While the prior art discusses the use of refractory transition metals (i.e. W, Ta, Pt, Au and the like), the present invention is operative with the additional elements comprising the lathanide series. Depleted uranium, further represents an operative member of the actinide series. With the exception of depleted uranium, actinide series elements are radioactive, making them dangerous to handle and wholly unsuitable in the present invention.

The lathanide series and depleted uranium are distinguished from the prior art transition metals by having an additional set of occupied electronic orbitals: f-orbitals. The lathanide energy spacings between orbitals are small leading to improved attenuation of many practical X-ray wavelengths. The formation of alloys and intermetallic compounds between the lathanides or depleted uranium and the refractory transition metals, especially gold, is the preferred embodiment for the incorporation of the lathanides or uranium into an exposure mask. Gold tends to form stable intermetallic compounds with the lathanides at a variety of compositions. The compositional region between compounds and the pure elements is typically characterized by a peritectic or eutectic point. A eutectic has a melting temperature lower than either the compound or the element. The lower melting temperature of the eutectic reduces the processing requirements.

The depression of melting and sintering temperatures associated with nanocrystal precursors is the basis for alloy or intermetallic compound formation at temperatures below bulk formation. The high surface area and high surface energy associated with a nanocrystal, in addition to facilitating phase transformation also enhances miscibility and reaction. The mixing of various compositions of nanocrystals and heating to a temperature sufficient to sitter or in some cases melt one of the component materials leads to alloy or intermetallic compound formation. The melting of one type of nanocrystal of an alloy mixture is advantageous in producing alloys since the mobility of species is markedly enhanced by a liquid transport phase.

With the use of the smallest nanocrystals, 1 nm in diameter, sintered features as narrow as 10 nm or less are attainable. However, considerable thickness of even high Z elements is required to make a suitable exposure mask. The layer thicknesses required are taught in the prior art for various photon energies and refractory metals (U.S. Pat. No. 4,515,876). Approximately, the high electron density material must be about 500 nm thick to achieve attenuations of 10 dB.

The mechanical stability of a rigid, cuboidal structure is dictated by the integrity of pinnings to the foundation and the height-to-width aspect ratio. In the case of a submicron exposure mask, the latter is controlled by matching thermal expansion and crystal lattices of adjoining layers; the height-to-width aspect ratio, while somewhat material dependent is limited by physical forces to a value of about 10.

Assuming the constraints of a 500 nm thick layer of high electron density material and the accompanying 10 dB attenuation limit, a height-to-width aspect ratio of 10 therefore yields a minimum effective feature width of 50 nm. It is however a technical challenging feat in the current art to produce rectilinear features on the scale of 50 nm width and a height-to-width ratio approaching 10. In the embodiments previously described, the sintering of an extended three-dimensional network of agglomerated nanocrystals having a high aspect ratio leads to some pattern distortion as the particle mass densifies.

This present invention as recited in regard to FIGS. 6A-G facilitates the formation of fine pattern features of high electron density material, characterized by high height-to-width aspect ratios. In this embodiment, the problem associated with pattern distortion in the course of particle sintering is largely overcome. The sequence of steps as recited in regard to FIGS. 4A-D are repeated in the instant embodiment as FIGS. 6A-D. The base layer, 95 is covered with a low electron density substrate, 96; which in turn is overlayered with a irradiation sensitive resin, 97.

Figure 6A:
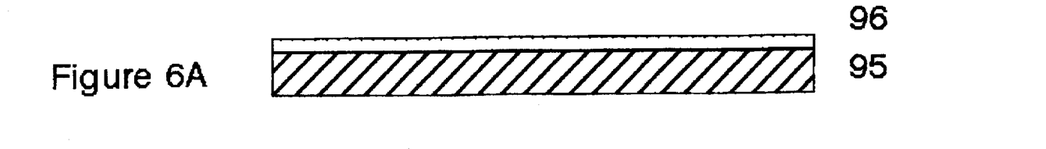
FIGS. 6A–G are schematic, modified-scale cross-sectional views illustrating the sequential steps in another embodiment of a method for fabricating an exposure mask according to the present invention, which is characterized by fine features of an electron dense material with high height-to-width aspect ratios.
Figure 6B:
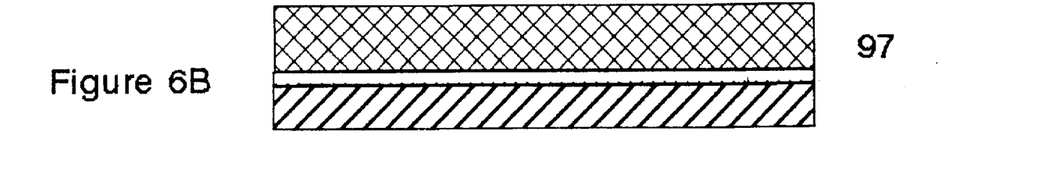
Figure 6C:
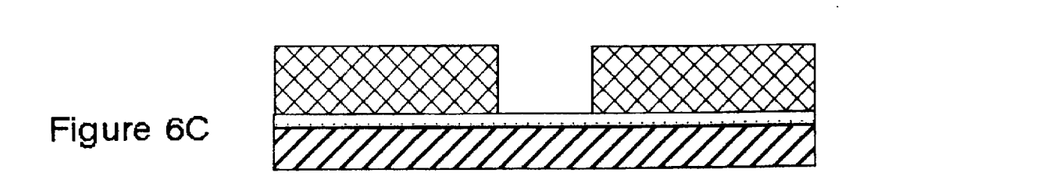
Figure 6D:
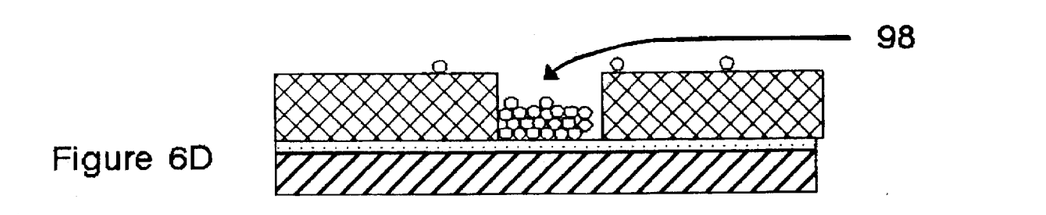

The patterned, resist coated surface of the low electron density layer is exposed to a nanocrystal source as shown in FIG. 6D. The exposure mask is heated to a temperature commensurate with nanocrystal sintering, yet below the bulk, FIG. 6E. The improvement offered by this processing step is the retention of feature form through the secondary use of the resist 97 as a mechanical retainer in the course of nanocrystal sintering.

Figure 6E:
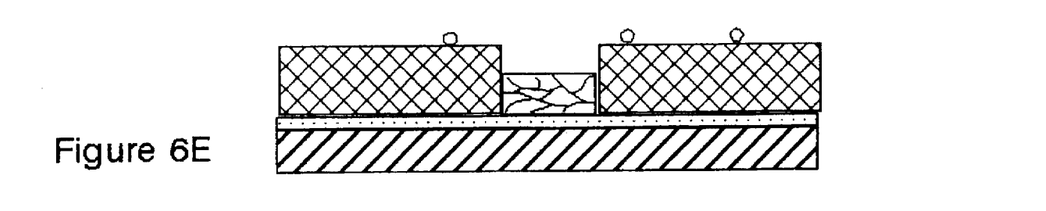

The successful completion of this process step places requirements on nanocrystal properties relative to the resist. The melting and or degradation temperature of the resist, 97 must be high relative to the sintering temperature of the size of the nanocrystals utilized. The degradation of the resist upon heating is lessened by processing under an inert atmosphere of helium; argon or even dinitrogen. The modest rigidity of practical photoresists at elevated temperatures precludes the use of all, but the smallest nanocrystals of the refractory metals. Appreciable softening and flow of the aforementioned photoresist, polymethylmethacrylate occurs at about 250° C., 1 to 5 nm particles of the high electron density materials are in general operative in this embodiment. The maximal size being dictated by the specific processing temperatures.

The sintering of nanocrystals outside the confines of the trenches scribed in the resist is not of concern where sufficient control over the hydrophilicity of the nanocrystals is maintained. The commonly used resists are long chain polymeric species which are generally hydrophobic. Since colloidal nanocrystals are often synthesized in alcoholic or aqueous solutions, there is little attraction between the hydrophobic resist and the hydrophilic nanocrystals. A consequence thereof is that the nanocrystals tend to adhere to the low electron density layer and one another preferentially as the colloidal solvent evaporates. While some nanocrystals are ultimately stranded on the resist surface, the sintering of these isolated nanocrystals does not usually constitute a problem in subsequent peel-off of the resist, 97. In instances where the resist-nanocrystal interactions are attractive, it is often necessary to utilize a lapping procedure of the resist surface, in order to dislodge the decorating nanocrystals prior to the nanocrystal sintering, FIG. 6E. The incorporation of resist debris into the top surface of the high electron density material feature is of little consequence in the operation of the exposure mask. The surface moieties of the nanocrystals and the colloidal solvent largely determine the necessity of a lapping step prior to nanocrystal sintering.

Figure 6F:
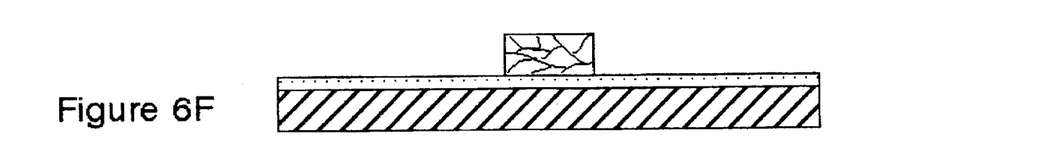
Figure 6G:
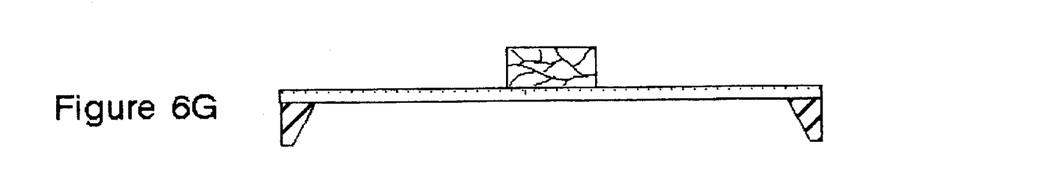

In FIG. 6F, the remaining resist, 97 is removed by conventional lift-off techniques. Resist removal is preferred to occur without subjecting the high electron density features to extreme physical forces such as sonication or rapid agitation which can damage the tall, slender exposure mask features. In FIG. 6G, the base layer, 95 is subjected to an etching process so as to form a supporting frame. Standard mineral acid etching is a commonly practiced art, especially in application to silicon and SiO2 base materials.

It is understood that the invention as recited in reference to FIG. 6A–H is operative with successive applications of nanocrystals, be they of the same or different composition. The invention is further described in the following Examples. The description of particular embodiments is not intended to limit the invention to these specific embodiments, but rather to illustrate the breadth of alternatives, modifications and equivalents that may be included within the scope as defined in the appended claims.

EXAMPLE 1

Onto the polished surface of a silicon wafer, 5 centimeters in diameter and 0.4 mm in thickness, a silicon nitride, SiN film of 300 nm thickness is applied by sputter coating. The silicon wafer is maintained at ambient temperature under a pressure of 1 mTorr argon during the sputtering process. Thereafter a poly(methylmethacrytate), (pMMA) resin, having a molecular weight of about 1 million is spun onto the silicon nitride film. The pMMA resin serves as the resist. The pMMA is then baked at 170° C. for one hour. The resist thickness is 800 nm, based on the parallax of glass beads of known size.

The pattern exposure is performed using a conventional electron beam tool. The pMMA resist is subjected to electron beam exposure so as to form a positive pattern template of 150 nm width.

The patterned substrate is then wetted with an aqueous colloidal solution of 2.0±0.2 nm gold nanocrystals produced by Biocell, Ltd. (Cardiff, Wales). The patterned substrate is then air dried. The application of the colloidal solution and the subsequent drying is repeated three times.

The pMMA resist is removed by dissolution in xylene. The adherent three-dimensional pattern of 2 nm gold nanocrystals are sintered on the SiN substrate by heating the wafer to 250° C. for 1 hour, resulting in a polycrystalline gold overlayer on the substrate. Finally, a predetermined disk of the silicon wafer is etched from the SiN substrate using a mixture of nitric and hydrofluoric acid which had been heated to 110° C.

The result, upon washing is an exposure mask having polycrystalline gold features with steep sides and widths determined by the electron beam write. Polycrystalline gold features with cross-sectional of 150 nm×600 nm are thereby produced.

EXAMPLE 2

Onto the polished surface of a sodium chloride crystal, 5 cm in diameter and 0.6 cm in thickness, 99.99% silicon monoxide, SiO is applied by vacuum evaporation. The sodium chloride crystal is maintained at ambient temperature during the course of the evaporation. Thereafter a poly(methylmethacrylate), (pMMA) resin, having a molecular weight of about 1 million is spun onto the silicon nitride film. The pMMA resin serves as the resist. The pMMA is then baked at 170° C. for one hour. The resist thickness is 800 nm, based on the parallax of glass beads of known size.

The pattern exposure is performed using a conventional electron beam tool. The pMMA resist is subjected to electron beam exposure so as to form a positive pattern template.

The patterned substrate is exposed to a solution of 3 nm platinum nanocrystals produced by the method detailed in the previously incorporated reference of D. Richard et al, using polyvinylpyrrolidone with an average molecular weight of 44,000 and a methanolic/aqueous solvent system. The substrate is then air dried. The application of the colloidal solution and subsequent drying is repeated three times.

The substrate is then heated to 200° C. under flowing dinitrogen and the temperature rapidly spiked to 400° C., then returned to 200° C., twice in succession over a one hour period. The substrate, still coated with pMMA is repeated dipped in toluene to dissolve the remaining pMMA resin.

The sodium chloride is selectively dissolved from the center of the exposure mask so as to leave a supporting ring of sodium chloride, by suspending the SiO substrate, with the underlying sodium chloride crystal over a vertical water jet. The flow of said water jet adjusted so as to gradually dissolve the sodium chloride.

The result is an exposure mask having polycrystalline platinum features with steep sides and widths determined by the electron beam write.

EXAMPLE 3

The process of Example 2 is repeated with successive application of colloidal solutions of said 3 nm platinum nanocrystals; a 1:1 stoichiometric mixture of said Pt nanocrystals with 5 nm (Tm~750° C.) gold nanocrystals produced by Biocell; and lastly, a neat solution of said 5 nm gold nanocrystals.

The result is an exposure mask having a graded composition that is enriched in polycrystalline platinum relative to gold near the interface with the SiO substrate.

What is claimed is:

1. An exposure mask, comprising:
   a substrate; and
   a polycrystalline layer resulting from the build-up and fusion of nanocrystalline precursors having domains of less than 60 nanometers, said layer being supported and patterned directly on said substrate, said layer having substantially zero internal stress.

2. The exposure mask of claim 1, wherein the material forming said layer is at least partially x-ray absorbent and wherein the material forming said substrate attenuates said x-rays to a lesser degree than said layer.

3. The exposure mask of claim 2, wherein said layer is derived from nanocrystals which are characterized in having melting and sintering temperatures less than those associated with the material in bulk form.

4. The exposure mask of claim 2, wherein said substrate has a thickness of between 0.1 and 10 microns.

5. The exposure mask of claim 2 wherein said layer is selected from the group consisting of gold, platinum, tungsten, tantalum, rhenium, palladium, depleted uranium, those lanthanide series metals that form water stable chlorides.

6. The exposure mask of claim 5, wherein said layer is formed into patterns on said substrate having feature widths as small as 10 nm.

7. The exposure mask of claim 2 wherein said substrate is selected from the group consisting of Be, BeO, BN, $B_2O_3$, SiN, SiC, $Si_3N_4$, $B_4C$, $AlB_4C$, AlN, $Al_2O_3$, SiO, $SiO_2$, polyamides, polyimides, polyesters, MYLAR, polycarbonates.

8. The exposure mask of claim 1, further comprising a dopant internal to said layer so as to cause said layer to adhere firmly against said substrate.

9. The exposure mask of claim 1, wherein said patterned layer has a cross-sectional height-to-width aspect ratio of about 10 and feature widths as small as 10 nm.

10. The exposure mask of claim 1, further including a plurality of polycrystalline layers, each resulting from the build-up and fusion of nanocrystalline precursors.

11. The exposure mask of claim 10, including different nanocrystalline precursors comprising at least two of the polycrystalline layers.

12. The method of fabricating an exposure mask using nanocrystal precursors comprising the steps of:

(a) providing a substrate having a supporting surface;

(b) depositing a layer of irradiation sensitive resin onto the surface of said substrate;

(c) selectively decomposing a pattern into said resin so as to expose selected regions of the surface of said substrate;

(d) depositing nanocrystals onto said resin and the exposed regions of said substrate;

(e) dissolving the resin from the surface of said substrate; and (f) sintering the nanocrystals at a temperature below the bulk sintering temperature, so as to yield patterned features derived from nanocrystals attached directly to the surface of said substrate.

13. The method of claim 12, wherein step (d) is repeated so as to form a multilayer structure.

14. The method of claim 12, wherein said nanocrystals are deposited from a colloidal solution.

15. The method of claim 13, wherein step (d) is repeated using compositionally different nanocrystals.

16. The method of claim 14, wherein a nanocrystal dopant is incorporated into said colloidal solution as a soluble salt.

17. The method of claim 12, wherein the nanocrystals have a mean diameter of from 1 to 10 nm.

18. The method of claim 12, wherein the nanocrystals are metals.

19. The method of claim 12, wherein the steps (e) and (f) are interposed, so as to facilitate the formation of pattern feature with height-to-width aspect ratios of about 10.

20. The method of claim 19, wherein step (d) is repeated so as to form a multilayer structure.

21. The method of claim 19, wherein step (f) is directly preceded by the substeps of:

lapping the resin layer so as to remove decorating nanocrystals from said resin surface; and removing excessive or loose debris produced in the lapping substep from said substrate.

22. An exposure mask, comprising:

a substrate; and a polycrystalline layer derived from the build-up and fusion of a nanocrystal precursor of a given size, said layer having a domain size relating to the size of the nanocrystal precursor, said layer being supported and patterned on said substrate, said layer having substantially zero internal stress.

23. The exposure mask of claim 22, wherein said domain size is less than 60 nanometers.

24. The exposure mask of claim 22, wherein said domain size is less than about 20 nanometers.

25. The exposure mask of claim 22, wherein said domain size is less than about 10 nanometers.

26. The exposure mask of claim 22, wherein said domain size is less than about 5 nanometers.

27. The exposure mask of claim 22, wherein said domain size is less than about 2 nanometers.

28. The exposure mask of claim 22, wherein said domain size is about 1 nanometer.

29. The exposure mask of claim 22, wherein said nanocrystal precursor is selected from the group consisting of gold, platinum, tantalum, tungsten, rhenium, palladium, depleted uranium and those lanthanide series metals that form water stable chlorides.

30. The exposure mask of claim 22, wherein said layer is composed of a thermodynamically stable compositional mixture consisting of at least one of the following: gold, platinum, tantalum, tungsten, rhenium, palladium, depleted uranium, and those lanthanide series metals that form water stable chlorides.

31. The exposure mask of claim 22, further including a plurality of polycrystalline layers, each resulting from the build-up and fusion of nanocrystalline precursors.

32. The exposure mask of claim 22, including different nanocrystalline precursors comprising at least two of the polycrystalline layers.

* * * * *